United States Patent
Marui et al.

(10) Patent No.: US 11,557,647 B2
(45) Date of Patent: Jan. 17, 2023

(54) SEMICONDUCTOR DEVICE AND MANUFACTURING METHOD THEREOF

(71) Applicant: NISSAN MOTOR CO., LTD., Yokohama (JP)

(72) Inventors: Toshiharu Marui, Kanagawa (JP); Tetsuya Hayashi, Kanagawa (JP); Keiichiro Numakura, Kanagawa (JP); Wei Ni, Kanagawa (JP); Ryota Tanaka, Kanagawa (JP); Keisuke Takemoto, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 26 days.

(21) Appl. No.: 17/048,174

(22) PCT Filed: Apr. 19, 2018

(86) PCT No.: PCT/IB2018/000561
§ 371 (c)(1),
(2) Date: Oct. 16, 2020

(87) PCT Pub. No.: WO2019/202349
PCT Pub. Date: Oct. 24, 2019

(65) Prior Publication Data
US 2021/0167166 A1   Jun. 3, 2021

(51) Int. Cl.
*H01L 29/06* (2006.01)
*H01L 29/10* (2006.01)
*H01L 29/45* (2006.01)

(52) U.S. Cl.
CPC ...... *H01L 29/0634* (2013.01); *H01L 29/1058* (2013.01); *H01L 29/1095* (2013.01); *H01L 29/45* (2013.01)

(58) Field of Classification Search
CPC ............ H01L 29/0634; H01L 29/1058; H01L 29/1095; H01L 29/45; H01L 29/735;
(Continued)

(56) References Cited

U.S. PATENT DOCUMENTS 6,097,063 A  8/2000 Fujihira
6,294,818 B1 9/2001 Fujihira
(Continued)

FOREIGN PATENT DOCUMENTS

JP  2000-286417 A  10/2000
JP  2006-279064 A  10/2006

OTHER PUBLICATIONS

Wen-Shan Lee et al., "Design and Fabrication of 4H SiC Lateral High-Voltage Devices on a Semi-Insulating Substrate", IEEE Transactions on Electron Devices, vol. 59, No. 3, Mar. 1, 2012, pp. 754-760.

*Primary Examiner* — Mohammad M Hoque
(74) *Attorney, Agent, or Firm* — Foley & Lardner LLP

(57) ABSTRACT

A semiconductor device includes: a drift region of a first conductive type including a contact section and extension sections extending along the main surface of a substrate; column regions of a second conductive type which alternate with the extension sections in a perpendicular direction to the extension direction of the extension sections and each includes an end connecting to the contact section; a well region of a second conductive type which connects to the other end of each column region and tips of the extension sections; and electric field relaxing electrodes which are provided above at least some of residual pn junctions with an insulating film interposed therebetween. Herein, the residual pn junctions are pn junctions other than voltage holding pn junctions formed in interfaces between the extension sections and the column regions.

12 Claims, 13 Drawing Sheets

(58) Field of Classification Search
CPC ............. H01L 29/0692; H01L 29/4236; H01L 29/6606; H01L 29/785; H01L 29/1608; H01L 29/404; H01L 29/66659; H01L 29/7835; H01L 29/861; H01L 29/872
USPC ........................................................ 257/330
See application file for complete search history.

(56) References Cited

U.S. PATENT DOCUMENTS

| | | | |
|---|---|---|---|
| 6,297,534 B1* | 10/2001 | Kawaguchi | H01L 29/7816 257/E29.066 |
| 6,528,849 B1* | 3/2003 | Khemka | H01L 29/7801 257/E29.264 |
| 6,627,948 B1 | 9/2003 | Fujihira | |
| 7,355,224 B2 | 4/2008 | Cai | |
| 9,653,595 B2* | 5/2017 | Niimura | H01L 29/0886 |
| 2002/0105024 A1 | 8/2002 | Fujihira | |
| 2002/0105025 A1 | 8/2002 | Fujihira | |
| 2002/0105026 A1 | 8/2002 | Fujihira | |
| 2002/0105027 A1 | 8/2002 | Fujihira | |
| 2002/0105028 A1 | 8/2002 | Fujihira | |
| 2004/0099923 A1 | 5/2004 | Tihanyi | |
| 2004/0212032 A1 | 10/2004 | Onishi et al. | |
| 2005/0017300 A1 | 1/2005 | Salama et al. | |
| 2008/0067624 A1* | 3/2008 | Chen | H01L 23/585 257/E29.066 |
| 2008/0138954 A1* | 6/2008 | Cai | H01L 29/7825 257/E29.066 |
| 2012/0058608 A1* | 3/2012 | Cheng | H01L 29/66681 257/E21.415 |
| 2014/0167060 A1* | 6/2014 | Santangelo | H01L 29/7816 257/272 |
| 2017/0222043 A1 | 8/2017 | Hirler et al. | |

* cited by examiner

SEMICONDUCTOR DEVICE AND MANUFACTURING METHOD THEREOF

TECHNICAL FIELD

The present invention relates to a semiconductor device and a manufacturing method thereof.

BACKGROUND ART

In order to implement high breakdown voltage and low on-resistance, a semiconductor device of a super-junction (SJ) structure has been developed, in which n-type semiconductor regions and p-type semiconductor regions are alternately arranged to form pn junctions periodically (see Patent Literature 1). In such a semiconductor device of the SJ structure, main current flows through a drift region with the concentration of n-type impurities increased, thus implementing low on-resistance. On the other hand, in reverse bias, the drift region is depleted due to depletion layers spreading from pn junctions, ensuring high breakdown voltage.

Citation List

Patent Literature

[PTL 1] Japanese Patent Laid-open Publication No. 2000-286417

SUMMARY OF INVENTION

Technical Problem

In an SJ structure semiconductor device in which the n-type drift regions and p-type column regions are alternately arranged, the electric field is uniform in interfaces between the column regions and the drift region where the depletion layers spread in different directions from the direction of the main current of the semiconductor device. However, the electric field concentrates in pn junctions other than the interfaces, thereby reducing the breakdown voltage.

The present invention has been made in the light of the aforementioned problems, and the purpose of the present invention is to provide a semiconductor device which includes a super junction structure with the breakdown voltage prevented from being reduced and a method of manufacturing the semiconductor device.

Solution to Problem

A semiconductor device according to an aspect of the present invention includes electric field relaxing electrodes provided above at least some of residual pn junctions with an insulating film interposed therebetween, the residual pn junctions being pn junctions other than voltage holding pn junctions formed in interfaces between extension sections of the drift region and column regions which constitute an SJ structure.

A method of manufacturing a semiconductor device according to another aspect of the present invention includes: forming electric field relaxing electrodes provided above at least some of residual pn junctions with an insulating film interposed therebetween, the residual pn junctions being pn junctions other than voltage holding pn junctions formed in interfaces between extension sections of the drift region and column regions which constitute an SJ structure.

Advantageous Effects of Invention

According to the present invention, it is possible to provide a semiconductor device which includes a super-junction structure with the breakdown voltage prevented from being reduced and a method of manufacturing the semiconductor device.

DESCRIPTION OF EMBODIMENT

Figure 1:
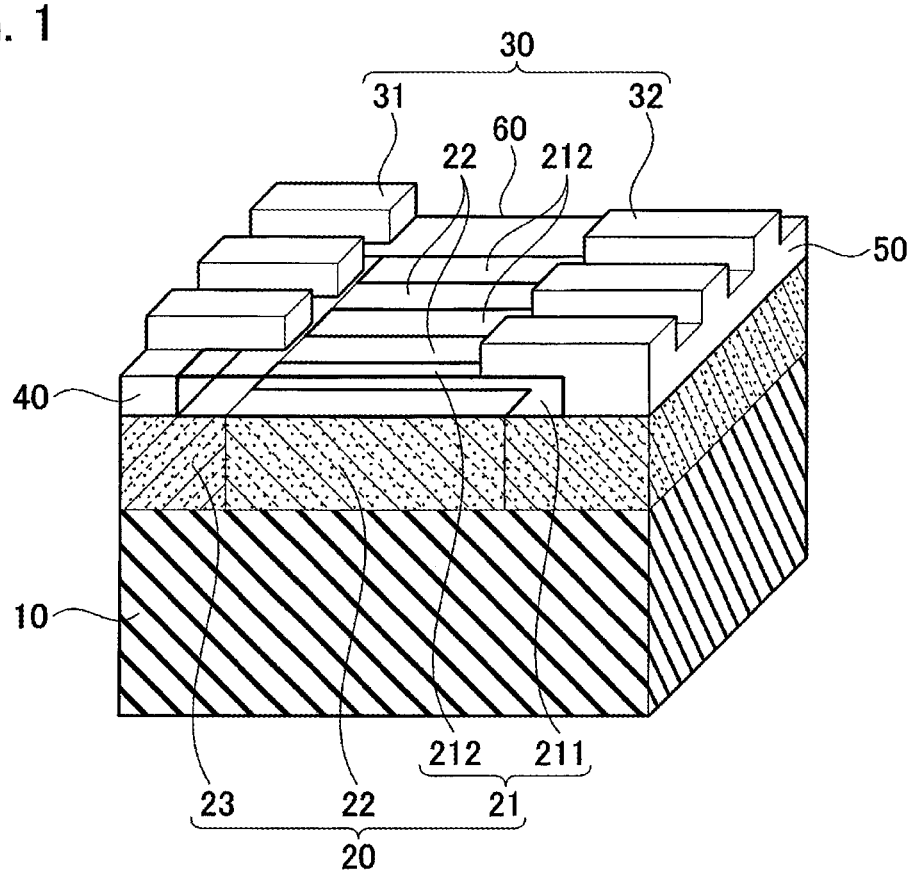
FIG. 1 is a schematic perspective view illustrating the configuration of a semiconductor device according to a first embodiment of the present invention.

The following describes embodiments with reference to the drawings. In the following description of the drawings, the same portions are given the same reference numerals, and the description thereof is omitted. The drawings are schematic, and the relationship between thickness and planar dimensions, the ratio in thickness of each layer, and the like are different from real ones. In addition, dimensional relationship or proportions of some portions are different from each other across the drawings.

First Embodiment

A semiconductor device according to a first embodiment of the present invention illustrated in FIG. 1 includes: a substrate 10; a semiconductor layer 20 provided on the main surface of the substrate 10; an insulating film 60 provided on the upper surface of the semiconductor layer 20; and electric field relaxing electrodes 30 provided above the semiconductor layer 20 with the insulating layer 60 interposed therebetween. FIG. 1 illustrates the semiconductor device as seen through the insulating film 60 for easy understanding of the structure of the semiconductor device. FIG. 1 illustrates only the outer edge of the insulating film 60 (the same applies to the following).

As illustrated in FIG. 1, the semiconductor layer 20 includes a drift region 21 of a first conductive type, column regions 22 of a second conductive type, and a well region 23 of a second conductive type. The drift region 21 includes: a contact section 211; and extension sections 212 extending from part of the contact section 211 along the main surface of the substrate 10. The column regions 22 are arranged so as to alternate with the extension regions 212 of the drift region 21 in a perpendicular direction to a direction (hereinafter, referred to as an extension direction) that the extension regions 212 extend. One end of each column region 22 connects to the contact section 211 of the drift region 21. The well region 23 connects to the other end of each column region 22 and the tip of each extension section 212 of the drift region 21.

The first and second conductive types are conductive types opposite to each other. The first conductive type is n-type while the second conductive type is p-type. Alternatively, the first conductive type is p-type while the second conductive type is n-type. In the following description, the first conductive type is n-type, and the second conductive type is p-type by way of example.

The semiconductor device illustrated in FIG. 1 has the SJ structure in which the extension sections 212 of the drift region 21 extend parallel to the main surface of the substrate 10 and the plural extension sections 212 and plural column regions 22 are alternately arranged. When reverse voltage is applied to the semiconductor device, the extension sections 212 of the drift region 21 and the column regions 22 are depleted due to depletion layers spreading from pn junctions (hereinafter, referred to as voltage holding pn junctions) formed in interfaces between the extension sections 212 of the drift region 21 and column regions 22. Therefore, the semiconductor device achieves a high breakdown voltage. In the following, pn junctions other than the voltage holding pn junctions are referred to as peripheral pn junctions.

The contact section 211 of the drift region 21 and the well region 23 are opposite to each other with the SJ structure interposed therebetween. Some of the peripheral pn junctions are formed (hereinafter, referred to as first peripheral pn junctions) in the regions where the well region 23 connects to the tips of the extension sections 212 of the drift region 21. Some of the peripheral pn junctions are formed (hereinafter, referred to as second peripheral pn junctions) in the regions where ends of the column regions 22 connect to the contact section 211 of the drift region 21. The insulating film 60 is provided above the drift region 21, column regions 22, and well region 23 so as to cover the first and second peripheral pn junctions.

The electric field relaxing electrodes 30 are provided above at least some of the peripheral pn junctions with the insulating film 60 interposed therebetween. In the semiconductor device illustrated in FIG. 1, the electric field relaxing electrodes 30 are provided above the first and second peripheral pn junctions.

The semiconductor device illustrated in FIG. 1 further includes: a first main electrode 40 electrically connecting to the well region 23; and a second main electrode 50 electrically connecting to the contact section 211 of the drift region 21. In FIG. 1, the first main electrode 40 is provided on the upper surface of the well region 23 while the second main electrode 50 is provided on the upper surface of the contact section 211.

The first main electrode 40 is an end of a current path of main current flowing through the semiconductor device when the semiconductor device is on. The second main electrode 50 is the other end of the current path of the main current. The semiconductor device illustrated in FIG. 1 is a diode including the first main electrode 40 as the anode electrode and the second main electrode 50 as the cathode electrode. Hereinafter, the first and second main electrodes 40 and 50 are collectively referred to as main electrodes.

The electric field relaxing electrodes 30 are provided above at least some of the peripheral pn junctions that are adjacent to the first main electrode 40 and each include a section electrically connecting to the first main electrode 40. The electric field relaxing electrodes 30 are further provided above at least some of the peripheral pn junctions that are adjacent to the second main electrode 50 and each include a section electrically connecting to the second main electrode 50. The electric field relaxing electrodes 30 illustrated in FIG. 1 include: first electrode sections 31, which are provided above the first peripheral pn junctions and are electrically connected to the first main electrode 40; and second electrode sections 32, which are provided above the second peripheral pn junctions and are electrically connected to the second main electrode 50.

Figure 2:
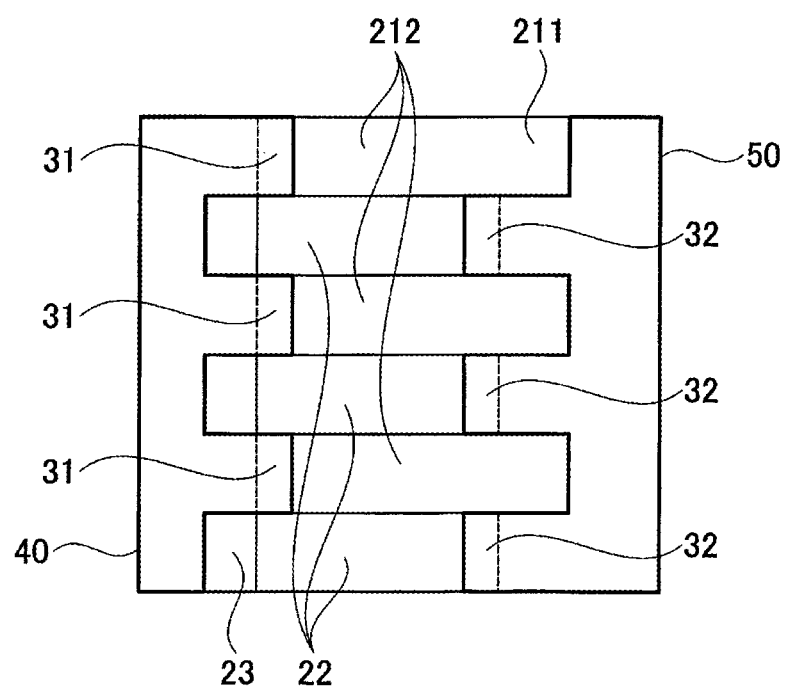
FIG. 2 is a schematic plan view illustrating the configuration of the semiconductor device according to the first embodiment of the present invention.

As illustrated in FIG. 2, the first electrode sections 31 extend from the first main electrode 40 and protrude over the first peripheral pn junctions to above the semiconductor layer 20. The second electrode sections 32 extend from the second main electrode 50 and protrude over the second peripheral pn junctions to above the semiconductor layer 20. The first electrode sections 31 have the same potential as the first main electrode 40 while the second electrode sections 32 have the same potential as the second main electrode 50. FIG. 2 illustrates the upper surface of the semiconductor layer 20 as seen through the first main electrode 40, second main electrode 50, electric field relaxing electrodes 30, and insulating film 60 (the same applies to plan views described below).

The following describes a basic operation of the semiconductor device illustrated in FIG. 1.

For on-state operation, low voltage (forward voltage) is applied to the second main electrode 50 with the first main electrode 40 set to a reference potential. This lowers the energy barrier between the well region 23 and the extension sections 212 of the drift region 21. Electrons thereby flow from the drift region 21 to the well region 23, so that forward current flows between the first and second main electrodes 40 and 50.

For off-state operation, high voltage (reverse voltage) is applied to the second main electrode 50 with the first main electrode 40 set to the reference potential. This increases the energy barrier between the well region 23 and the extension sections 212 of the drift region 21. Electrons are thereby prevented from flowing from the drift region 21 to the well region 23.

Figure 3:
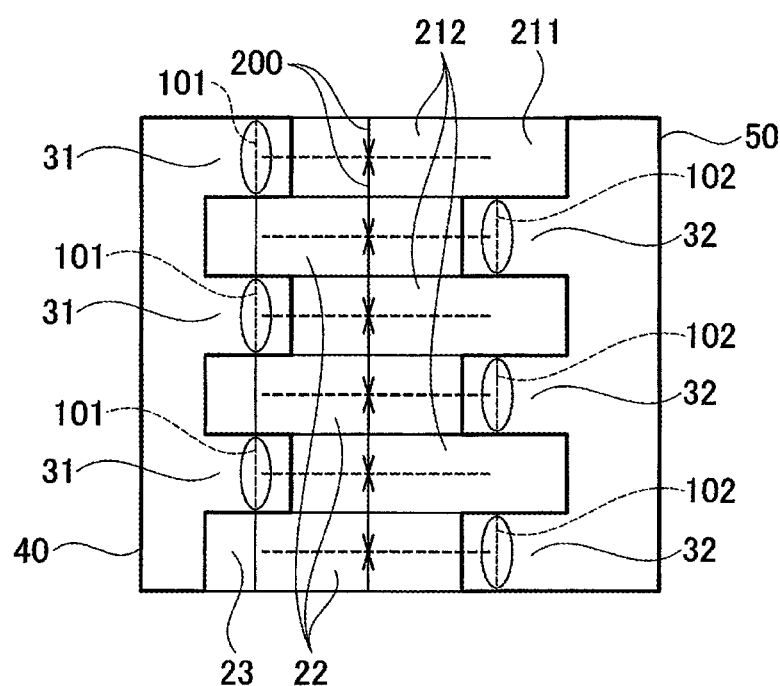
FIG. 3 is a schematic plan view illustrating the state of the semiconductor device according to the first embodiment of the present invention when reverse voltage is applied thereto.

In the off-state, as indicated by arrows 200 in FIG. 3, depletion layers also spread from the interfaces between the extension sections 212 of the drift region 21 and the column regions 22. When the reverse voltage is increased to a certain degree, the extension sections 212 of the drift region 21 and column regions 22 are both completely depleted (pinch-off state). In the pinch-off state, the electric field in the extension sections 212 of the drift region 21 and the column regions 22 uniformly distributes in a rectangular shape, and the maximum electric field applied to the semiconductor device is reduced significantly. This increases the breakdown voltage of the semiconductor device.

In order to completely deplete the SJ structure in the off state for high breakdown voltage, the ratio in total amount of n-type impurities of n-type semiconductor regions to p-type impurities of p-type semiconductor regions is set to around 1. Concentration Nd of n-type impurities of the extension sections 212 of the drift region 21, concentration Na of p-type impurities of the column regions 22, width Wn of the extension sections 212, and width Wp of the column regions 22 are set so as to satisfy Expression 1 below:

$$Na \times Wp = Nd \times Wn \quad (1)$$

The widths Wn and Wp are widths in the direction that the extension sections 212 of the drift region 21 and the column regions 22 alternate.

By setting the impurity concentrations of the extension sections 212 of the drift region 21 and the column regions 22 so as to satisfy Expression (1), the extension sections 212 and column regions 22 are depleted due to the depletion layers spreading from the voltage holding pn junctions, thereby providing high breakdown voltage. In addition, the resistance of the drift region 21 is reduced.

When reverse voltage is applied to the semiconductor device, the electric field tends to concentrate in the first and second peripheral pn junctions 101 and 102 surrounded by circles in FIG. 3. This is because the relationship of Expression (1) is not satisfied in the peripheral pn junctions and charges are not balanced across the n-type semiconductor regions and p-type semiconductor regions. Such electric field concentration in the peripheral pn junctions lowers the breakdown voltage of the semiconductor device.

In the semiconductor device illustrated in FIG. 1, the electric field relaxing electrodes 30 are provided above the peripheral pn junctions, so that the gradient of the potential distribution is gentle. The electric field concentration is thereby relaxed. By providing the electric field relaxing electrodes 30 above the peripheral pn junctions, depletion layers uniformly spread in the peripheral pn junctions. Controlling curvatures of the depletion layers in such a manner allows the potential to change smoothly, thereby relaxing the electric field concentration. The electric field concentration is thus relaxed in the first and second peripheral pn junctions 101 and 102.

By providing the first electrode sections 31, which have the same potential as the first main electrode 40, above the first peripheral pn junctions 101, which are adjacent to the first main electrode 40, the electric field concentration in the first peripheral pn junctions 101 is relaxed considerably. By providing the second electrode sections 32, which have the same potential as the second main electrode 50, above the second peripheral pn junctions 102, which are adjacent to the second main electrode 50, the electric field concentration in the second peripheral pn junctions 102 is relaxed considerably.

The effect of the electric field relaxing electrodes 30 on relaxing the electric field concentration is described below using models illustrated in FIGS. 4 and 5.

Figure 4:
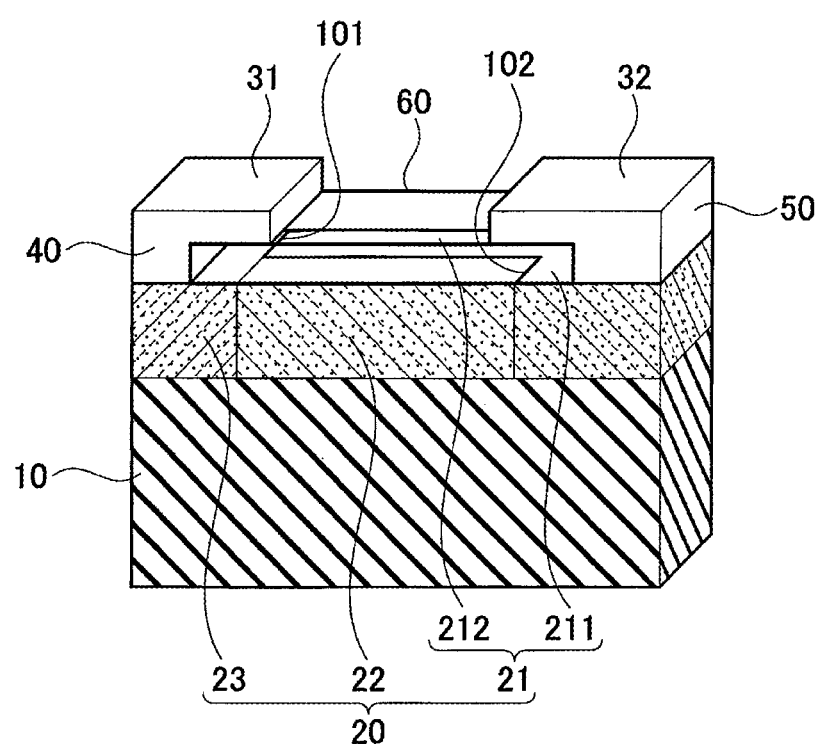
FIG. 4 is a perspective view illustrating an embodiment model for calculating electric field intensity.
Figure 5:
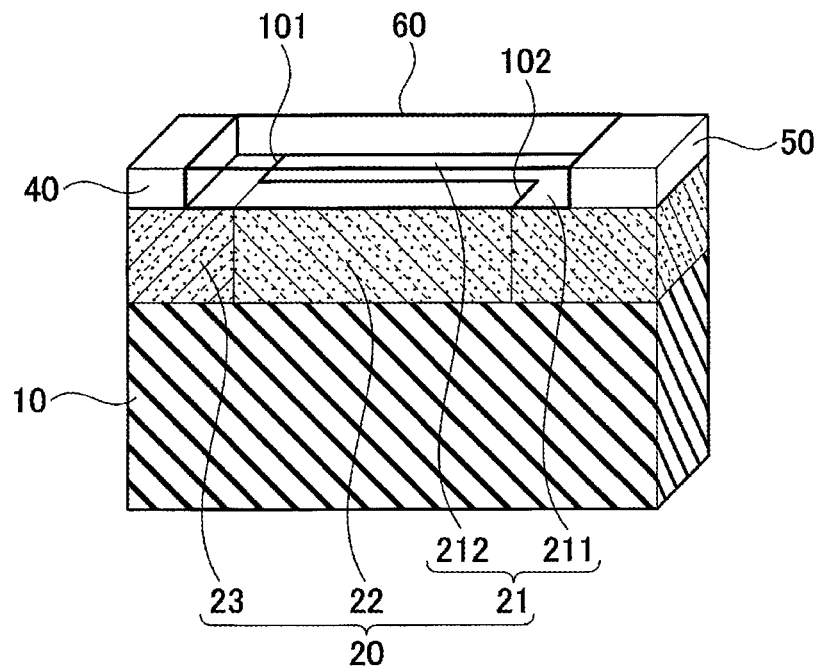
FIG. 5 is a perspective view illustrating a comparative model for calculating electric field intensity.

The model illustrated in FIG. 4 is an embodiment model in which the electric field relaxing electrodes 30 are provided above the first and second peripheral pn junctions 101 and 102 in a similar manner to the semiconductor device illustrated in FIG. 1. Specifically, the first electrode section 31 of the electric field relaxing electrodes 30, which connects to the first main electrode 40, is provided above the first peripheral pn junction 101, and the second electrode section 32 of the electric field relaxing electrodes 30, which connects to the second main electrode 50, is provided above the second peripheral pn junction 102. The model illustrated in FIG. 5 is a comparative model not including the electric field relaxing electrodes 30.

Figure 6:
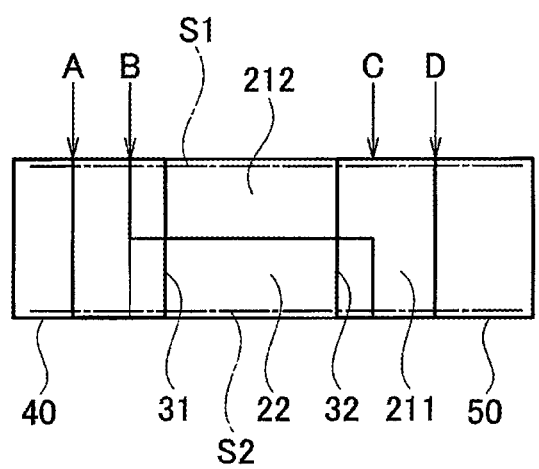
FIG. 6 is a plan view for explaining cross sections for which the electric field intensity is calculated.

FIG. 6 illustrates ranges of a first cross section S1 and a second cross section S2 subjected to calculation of electric field intensity. The first cross section S1 is a cross section along the extension direction, including the first peripheral pn junction 101. The second cross section S2 is a cross section along the extension direction, including the second peripheral pn junction 102. Position A corresponds to an end of the region where the well region 23 connects to the first main electrode 40; position B corresponds to the first peripheral pn junction 101; position C corresponds to the second peripheral pn junction 102; and position D corresponds to an end of the region where the drift region 21 connects to the second main electrode 50.

Figure 7:
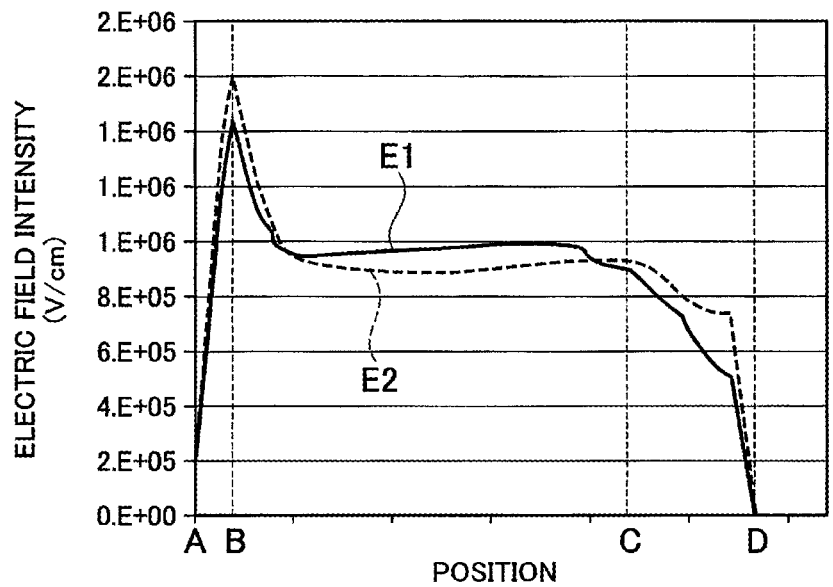
FIG. 7 is a graph illustrating the result of calculating the electric field intensity along a first cross-section.
Figure 8:
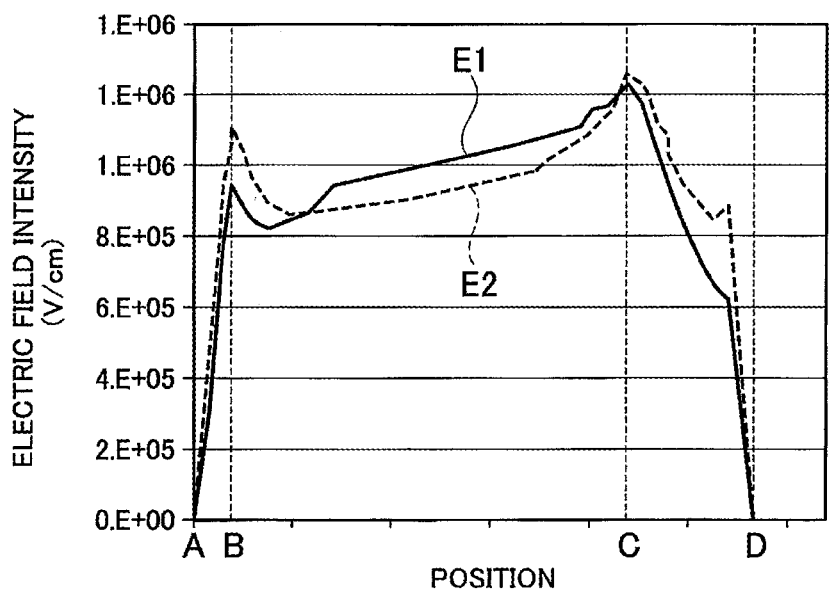
FIG. 8 is a graph illustrating the result of calculating the electric field intensity along a second cross-section.

FIG. 7 illustrates the results of calculating the electric field intensity along the first cross section S1, and FIG. 8 illustrates the results of calculating the electric field intensity along the second cross section S2. In FIGS. 7 and 8, the electric field intensity of the embodiment model illustrated in FIG. 4 is indicated by characteristic E1 (in a solid line), and the electric field intensity of the comparative model illustrated in FIG. 5 is indicated by characteristic E2 (in a dashed line).

As illustrated in FIG. 7, in the first cross section S1, the peak of the electric field intensity at the position B of the first peripheral pn junction 101 is lower in the embodiment model than in the comparative model. This means that the corresponding electric field relaxing electrode 30 relaxes the electric field concentration in the first peripheral pn junction section 101.

As illustrated in FIG. 8, in the second cross section S2, the peak of the electric field intensity at the position C of the second peripheral pn junction 102 is lower in the embodiment model than in the comparative model. This means that the corresponding electric field relaxing electrode 30 relaxes the electric field concentration in the second peripheral pn junction section 102. In the second cross section S2, the peak of the electric field intensity at the position B is also lower in the embodiment model than in the comparative model. This is because, in the embodiment model illustrated in FIG. 4, the first electrode section 31 of the electric field relaxing electrodes 30 is also provided above the interface between the well region 23 and column region 22, which include different impurity concentrations, so that the electric field concentration is relaxed.

Herein, providing the electric field relaxing electrodes 30 above all the peripheral pn junctions increases the effect on reducing the reduction in breakdown voltage. However, providing the electric field relaxing electrodes 30 above at least some of the peripheral pn junctions also reduces the reduction in breakdown voltage.

The electric field relaxing electrodes 30 may be configured not to be provided in some regions. This reduces the parasitic capacitance produced between the electric field relaxing electrodes 30 and the semiconductor device 20.

For example, the electric field relaxing electrodes 30 may be provided above the first peripheral pn junctions 101 while no electric field relaxing electrode 30 is provided above the second peripheral pn junctions 102. The electric field relaxing electrodes 30 may be provided above the second peripheral pn junctions 102 while no electric field relaxing electrode 30 is provided above the first peripheral pn junctions 101. Alternatively, the electric field relaxing electrodes 30 may be provided only above some of the first peripheral pn junctions 101 or may be provided only above some of the second peripheral pn junction 102.

In the semiconductor device illustrated in FIG. 1, as illustrated in FIGS. 2 and 3, the width of each electric field relaxing electrode 30 in the perpendicular direction to the extension direction is greater in the region above any peripheral pn junction than in the other region. In other words, the electric field relaxing electrodes 30 are not provided above the semiconductor layer 20 other than the peripheral pn junctions. This reduces the parasitic capacitance produced between the electric field relaxing electrodes 30 and the region other than the peripheral pn junctions while relaxing the electric field concentration in the peripheral pn junctions.

As described above, with the semiconductor device according to the first embodiment of the present invention, the electric field relaxing electrodes 30 are provided above the peripheral pn junctions to relax the electric field concentration in the peripheral pn junctions. This reduces the reduction in breakdown voltage of the semiconductor device including the SJ structure.

The substrate 10 is preferably an insulating substrate. Using an insulating substrate simplifies the isolation process in the case where plural semiconductor devices are integrated in the same substrate 10. In addition, at mounting the semiconductor device in a cooler, the insulating substrate to be laid between the substrate 10 and cooler can be omitted. Herein, the insulating substrate refers to a substrate with a resistivity of not less than several kΩ·cm.

The substrate 10 is made of insulating silicon carbide (SiC), for example. SiC includes some polytypes (polymorphs), and typical 4H—SiC substrates can be used as the substrate 10. By using such the SiC substrate as the substrate 10, the substrate 10 has high insulation and high thermal conductivity. The backside of the substrate 10 therefore can be directly attached to a cooling mechanism for efficient cooling of the semiconductor device. Since the SiC substrate has a high thermal conductivity, such a structure is able to efficiently dissipate heat generated by the main current when the semiconductor device is on. SiC is a wide bandgap semiconductor and includes few intrinsic carriers. SiC therefore easily implements high insulation and provides a semiconductor device with high breakdown voltage.

The following describes a method of manufacturing the semiconductor device according to the first embodiment of the present invention with reference to the drawings. The following method of manufacturing the semiconductor device is just an example and can be implemented by other various manufacturing methods including modifications of the same.

Figure 9:
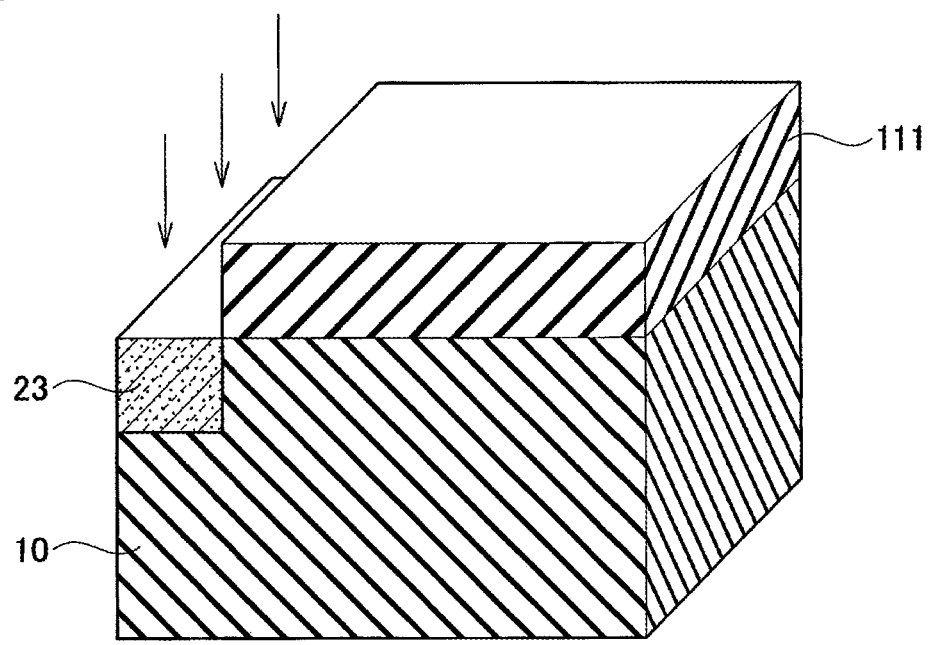
FIG. 9 is a perspective view for explaining a method of manufacturing the semiconductor device according to the first embodiment of the present invention (No. 1).

First, in the main surface of the substrate 10 made of an undoped silicon carbide insulating semiconductor, the well region 23 is formed by ion implantation. For example, as illustrated in FIG. 9, a mask material 111 formed on the entire main surface of the substrate 10 is patterned to expose a region of the substrate 10 where the well region 23 is to be formed. Ion implantation to dope the substrate 10 with p-type impurities is performed using the mask material 111 as a mask to selectively form the well region 23. The impurity concentration of the well region 23 is about 1E15 to $1E19/cm^3$, for example.

The mask material is generally silicon oxide film, and the deposition process can be either thermal CVD or plasma CVD. The patterning method can be photolithography. Specifically, the mask material is etched using a patterned photoresist film as a mask. The etching can be wet etching using hydrofluoric acid or dry etching such as reactive ion etching. Next, the photoresist film is removed by oxygen plasma, sulfuric acid, or the like. The mask material is thus patterned.

Figure 10:
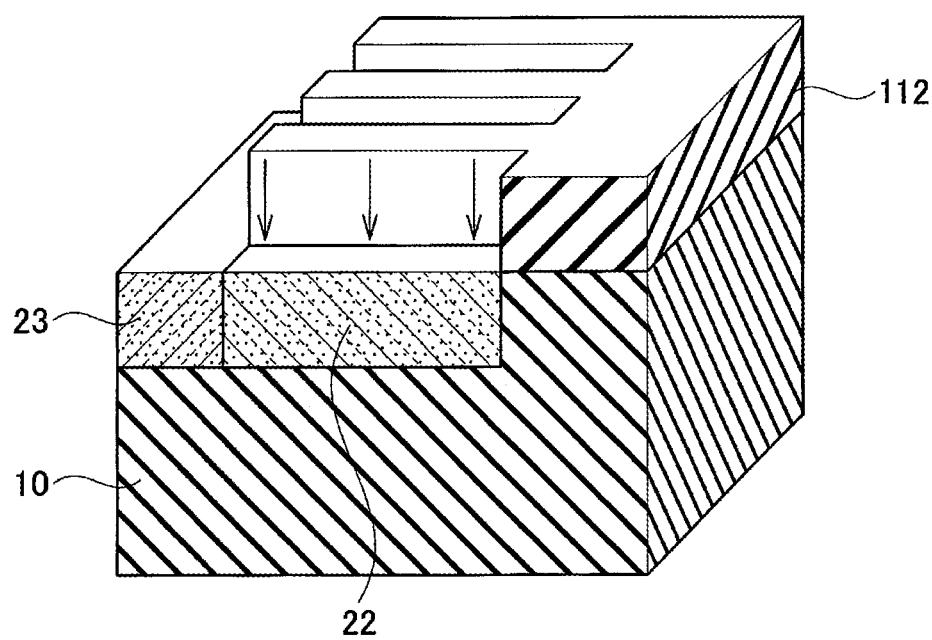
FIG. 10 is a perspective view for explaining the method of manufacturing the semiconductor device according to the first embodiment of the present invention (No. 2).
Figure 11:
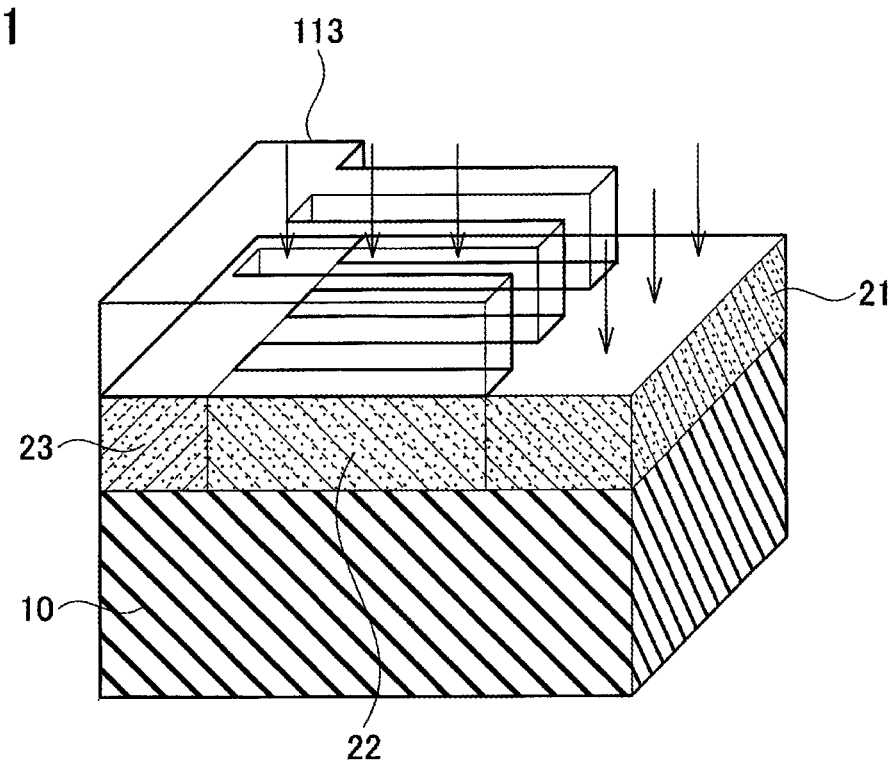
FIG. 11 is a perspective view for explaining the method of manufacturing the semiconductor device according to the first embodiment of the present invention (No. 3).

Next, as illustrated in FIG. 10, the substrate 10 is doped with p-type impurities by ion implantation using a new patterned mask material 112 as a mask to selectively form the column regions 22. As illustrated in FIG. 11, the substrate 10 is doped with n-type impurities by ion implantation using a patterned mask material 113 as a mask to selectively form the drift region 21. For easy understanding of the structure, FIG. 11 illustrates only the outer edge of the mask material 113. The impurity concentrations of the column and drift regions 22 and 21 are about 1E15 to $1E19/cm^3$, for example.

The ion implantation in the aforementioned processes uses nitrogen (N) as the n-type impurities and aluminum (Al) or boron (B) as the p-type impurities, for example. The ion implantation is preferably performed for the substrate 10 heated to about 600° C. This prevents crystal defects from occurring in the regions subjected to the ion implantation. The substrate 10 is then subjected to heat treatment to activate the ion-implanted impurities. The substrate 10 is subjected to heat treatment at about 1700° C. in an argon or nitrogen atmosphere, for example.

Figure 12:
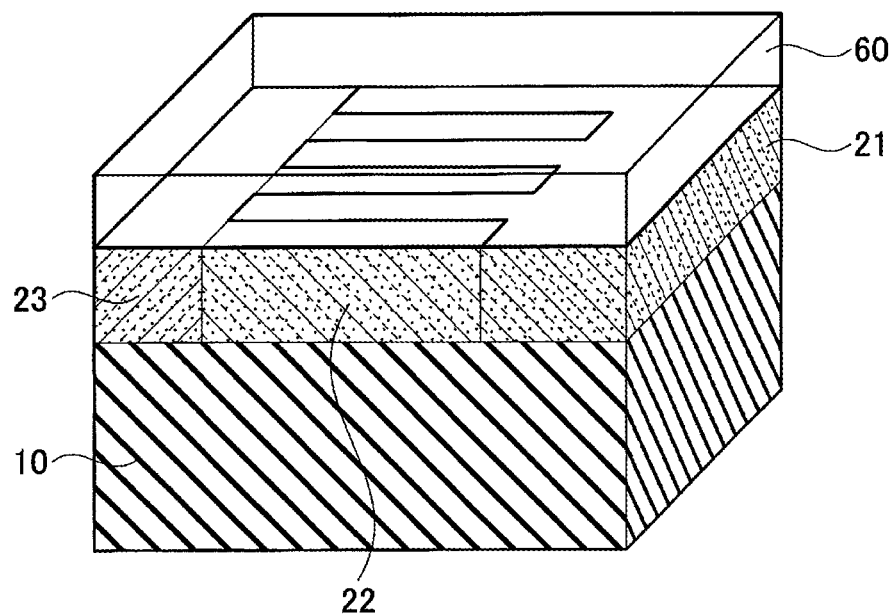
FIG. 12 is a perspective view for explaining the method of manufacturing the semiconductor device according to the first embodiment of the present invention (No. 4).

Next, the insulating film 60 is formed on the drift region 21, column regions 22, and well region 23 as illustrated in FIG. 12. The insulating film 60 can be silicon oxide film, for example. The silicon oxide film can be deposited by thermal CVD or plasma CVD.

Figure 13:
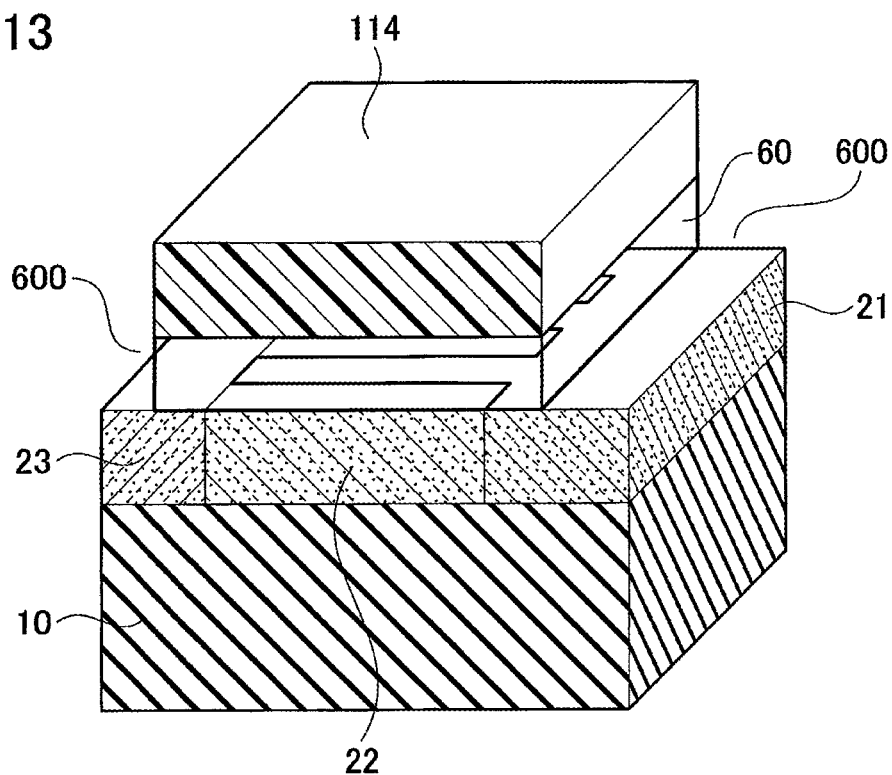
FIG. 13 is a perspective view for explaining the method of manufacturing the semiconductor device according to the first embodiment of the present invention (No. 5).

As illustrated in FIG. 13, the insulating film 60 is then selectively etched using a photoresist film 114 patterned by photolithography, as a mask, to form contact holes 600. The etching is wet etching using fluoric acid or dry etching such as reactive ion etching, for example.

Figure 14:
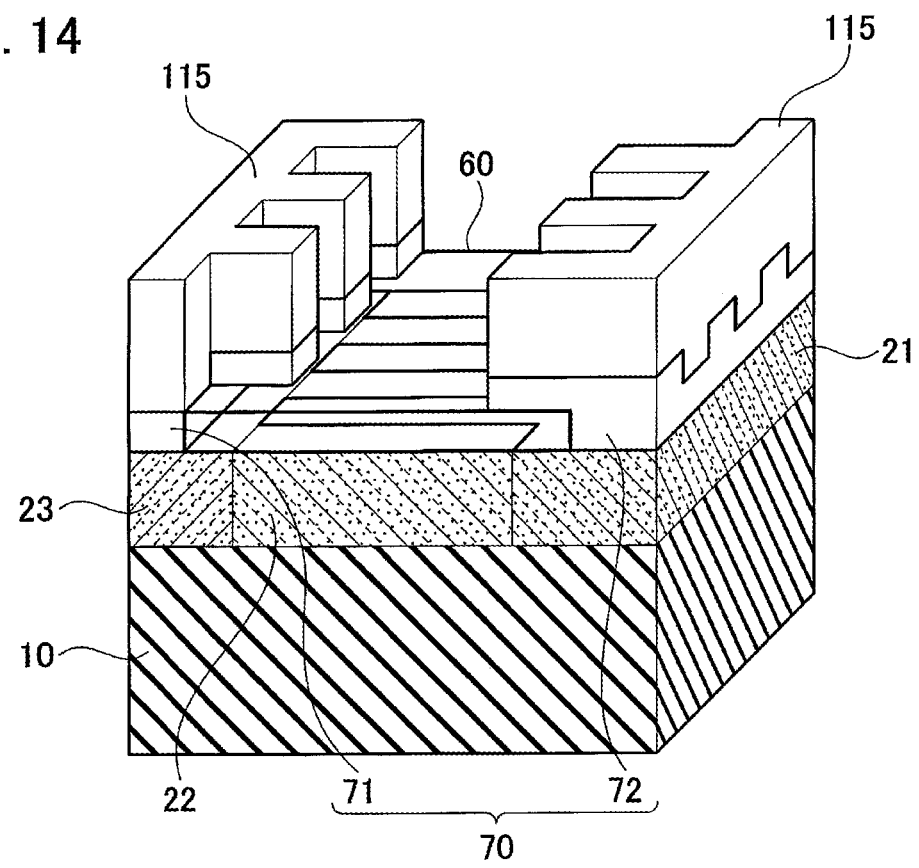
FIG. 14 is a perspective view for explaining the method of manufacturing the semiconductor device according to the first embodiment of the present invention (No. 6).

Next, electrode films 70 are formed to fill the contact holes 600. The electrode films 70 are then patterned by dry etching using a photoresist film 115 as a mask as illustrated in FIG. 14, for example. The electrode films 70 include: a first electrode film 71 for both the first main electrode 40 and the first electrode sections 31 of the electric field relaxing electrodes 30; and a second electrode film 72 for both the second main electrode 50 and the second electrode sections 32 of the electric field relaxing electrodes 30.

Each of the electrode films 70 is generally metallic film. The material of each electrode film 70 can be a metallic material, including titanium (Ti), nickel (Ni), and molybdenum (Mo). Each electrode film 70 may be laminate film of titanium/nickel/silver (Ti/Ni/Ag) or the like. The electrode films 70 are formed by depositing the metallic material on the entire surface by spattering, electron beam (EB) vapor deposition, or the like and then etching the metallic material. Alternatively, the electrode films 70 may be formed by filling the contact holes 600 with the metallic material by a plating process.

In this process, the electrode films 70 are formed so that some sections of the first electrode film 71 and some sections of the second electrode film 72 cover the peripheral pn junctions with the insulating film 60 interposed therebetween. The sections of the first electrode film 71 provided above the first peripheral pn junctions 101 correspond to the first electrode sections 31 of the electric field relaxing electrodes 30. The sections of the second electrode film 72 provided above the second peripheral pn junctions 102 correspond to the second electrode sections 32 of the electric field relaxing electrodes 30.

In the example described above, the drift region 21 and column regions 22 are formed by ion implantation of impurities into the substrate 10. By forming the drift region 21 and column regions 22 through ion implantation, the manufacturing cost is reduced compared with the case of using epitaxial growth.

In the aforementioned example, the substrate 10 is the SiC substrate. However, the substrate 10 is not limited to the SiC substrate and can be made of a semiconductor material having a wide bandgap. The semiconductor material having a wide bandgap is GaN, diamond, ZnO, AlGaN, or the like.

In the aforementioned example, each of the electric field relaxing electrodes 30 is consistent in width from the section connected to any main electrode to the tip located above the semiconductor layer 20. However, the electric field relaxing electrodes 30 may be wider above the peripheral pn junctions than in the other part as illustrated in FIG. 15, for example, in order to reduce the parasitic capacitance produced between the electric field relaxing electrodes 30 and the semiconductor layer 20.

Figure 15:
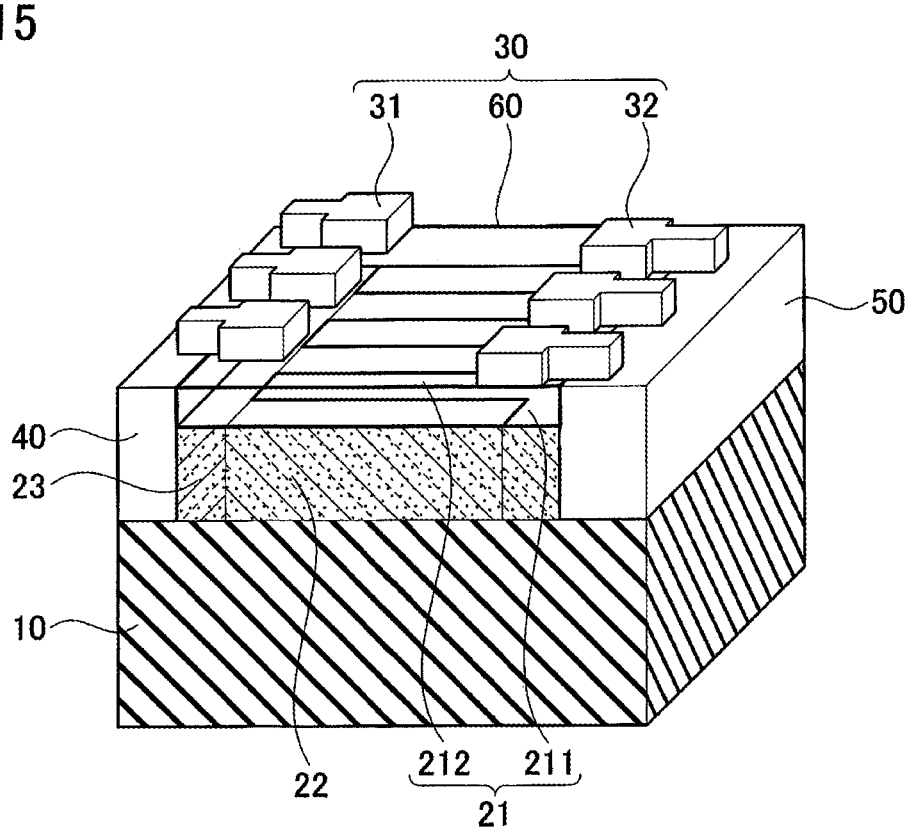
FIG. 15 is a schematic perspective view illustrating another shape example of electric field relaxing electrodes of the semiconductor device according to the first embodiment of the present invention.
Figure 16:
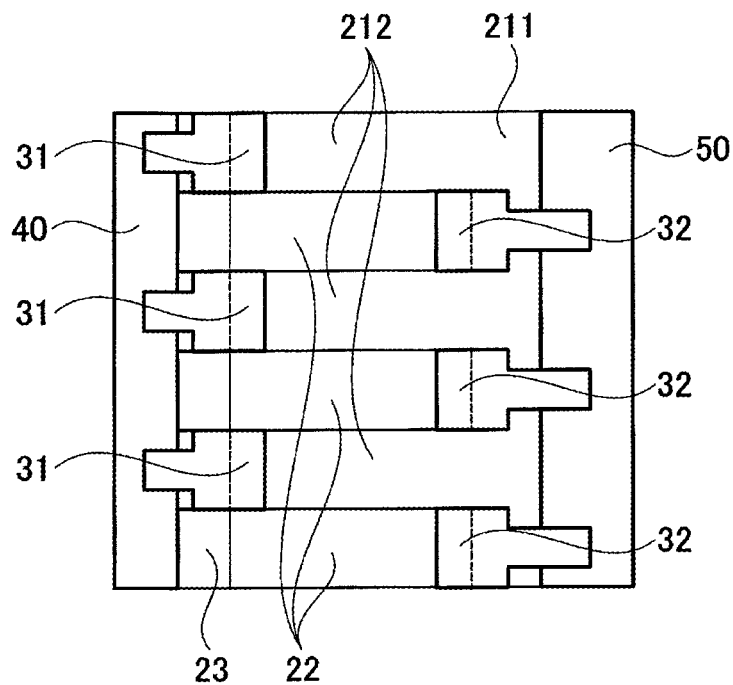
FIG. 16 is a schematic plan view of the semiconductor device illustrated in FIG. 15.

In the semiconductor device illustrated in FIG. 15, as illustrated in FIG. 16, the electric field relaxing electrodes 30 are formed so that the widths of the sections connected to the main electrodes are narrower than the widths of the sections directly above the peripheral pn junctions. Directly above each peripheral pn junction, the peripheral pn junction is fully covered with any electric field relaxing electrode 30. When the electric field relaxing electrodes 30 are configured to be narrower in the sections other than the sections covering the peripheral pn junctions in such a manner, the parasitic capacitance produced between the electric field relaxing electrodes 30 and the semiconductor layer 20 is reduced.

First Modification

In a semiconductor device according to a first modification of the first embodiment (illustrated in FIG. 17), the lower surface of each of the electric field relaxing electrodes 30, which faces the substrate 10, inclines to the main surface of the substrate 10, and the distance between the lower surface of the electric field relaxing electrode 30 and the main surface of the substrate 10 gradually decreases toward the corresponding main electrode. Specifically, the distance between the lower surface of each of the first electrode sections 31 of the electric field relaxing electrodes 30 and the main surface of the substrate 10 decreases toward the first main electrode 40. The distance between the lower surface of each of the second electrode sections 32 of the electric field relaxing electrodes 30 and the main surface of the substrate 10 decreases toward the second main electrode 50.

Figure 17:
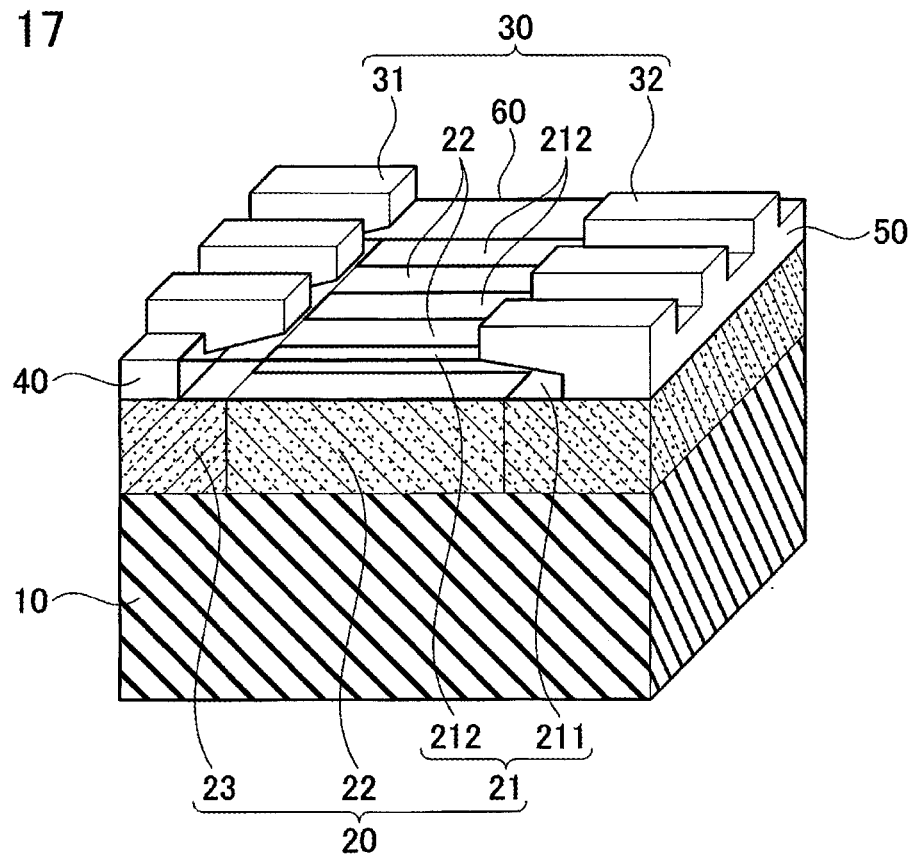
FIG. 17 is a schematic perspective view illustrating the configuration of a semiconductor device according to a first modification of the first embodiment of the present invention.

In the semiconductor device illustrated in FIG. 17, the electric field of each peripheral pn junction spread in the entire inclined region of the corresponding electric field relaxing electrode 30. According to the semiconductor device illustrated in FIG. 17, compared with the semiconductor device in which the lower surfaces of the electric field relaxing electrodes 30 are parallel to the main surface of the substrate 10, the electric field do not concentrate significantly to the end of each electric field relaxing electrode 30, and the electric field concentration is further relaxed.

The distance between the lower surface of each electric field relaxing electrode 30 and the substrate 10 may be configured to decrease gradually so that the distance between the peripheral pn junction below the electrode field relaxing electrode 30 and each section of the lower surface of the electric field relaxing electrode 30 is substantially consistent. Specifically, the distance between each first peripheral pn junction 101 and the lower surface of the corresponding first electrode section 31 is nearly consistent from an end of the first electrode section 31 located above the semiconductor layer 20 to the other end connecting to the first main electrode 40. The distance between each second peripheral pn junction 102 and the lower surface of the corresponding second electrode section 32 is nearly consistent from an end of the second electrode section 32 located above the semiconductor layer 20 to the other end connecting to the second main electrode 50.

The electric field thereby distributes uniformly in the entire inclined region of each electric field relaxing electrode 30, so that the electric field concentration is further relaxed. For example, the distance between each peripheral pn junction and each section of the lower surface of the corresponding electric field relaxing electrode 30 can be consistent by setting the angle between the lower surface of the electric field relaxing electrode 30 and the main surface of the substrate 10 to 45 degrees.

In the manufacturing process of the semiconductor device illustrated in FIG. 17, after the insulating film 60 is formed, the upper surface of the insulating film 60 is etched by wet etching, for example, so that the upper surface of the insulating film 60 is inclined with respect to the main surface of the substrate 10. The electric field relaxing electrodes 30 are then formed on the upper surface of the insulating film 60. The electric field relaxing electrodes 30 illustrated in FIG. 17 are thus obtained. The lower surfaces of the electric field relaxing electrodes 30 may be smoothly inclined or may include a stepped structure inclining as a whole.

Second Modification

In a semiconductor device according to a second modification of the first embodiment (illustrated in FIG. 18), the drift region 21 includes a layered section 213 which is layered on the column regions 22 in the thickness direction of the substrate 10 and is located under the column regions 22. An end of the layered section 213 connects to the contact section 211 of the drift region 21, and the other end connects to the well region 23.

Figure 18:
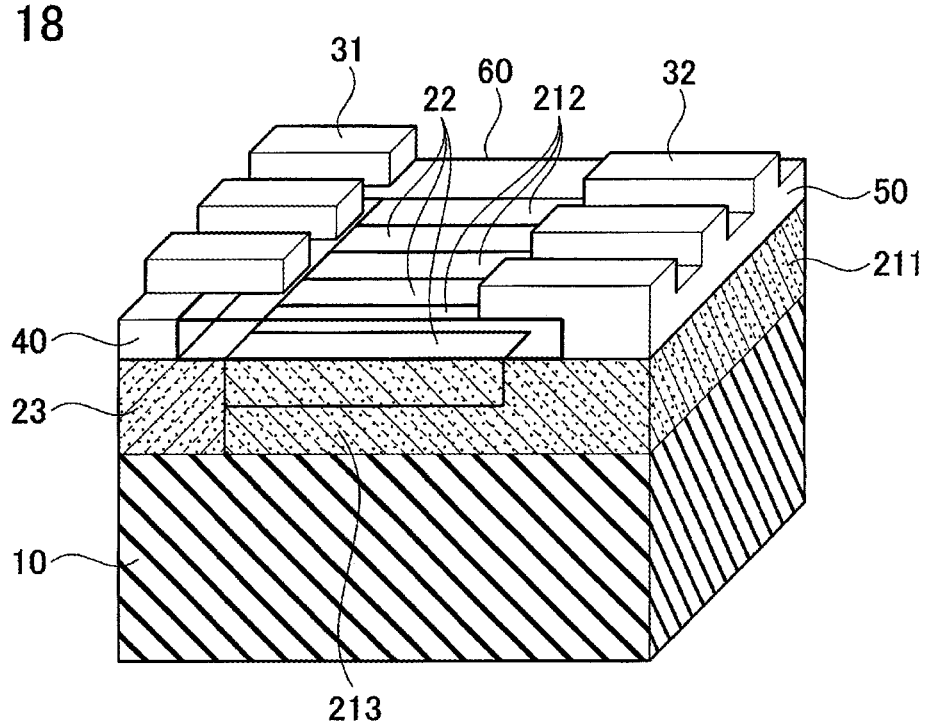
FIG. 18 is a schematic perspective view illustrating the configuration of a semiconductor device according to a second modification of the first embodiment of the present invention.

According to the semiconductor device illustrated in FIG. 18, the layered section 213 of the drift region 21 is provided directly under the column regions 22, thus increasing the cross section of the current path of the main current when the semiconductor device is on. This reduces the on resistance per unit area.

In order that the layered section 213 is pinched off when the semiconductor device is off, the layered section 213 is formed so as to satisfy Expression (1) where the width Wn is the thickness of the layered section 213. In the example illustrated in FIG. 18, the layered section 213 is provided under the column regions 22. However, the layered section 213 may be provided above the column regions 22.

Third Modification

In a semiconductor device according to a third modification of the first embodiment of the present invention (illustrated in FIG. 19), an extension section 212 of the drift region 21 and a column region 22 are layered on each other in the thickness direction of the substrate 10. The impurity concentrations and thicknesses of the extension section 212 and column region 22 are set to satisfy Expression (1). The semiconductor device illustrated in FIG. 19 includes an SJ structure in the thickness direction of the substrate 10.

In the semiconductor device illustrated in FIG. 1, the widths of the extension sections 212 of the drift region 21 and the column regions 22 in the horizontal direction parallel to the main surface of the substrate 10 depend on the accuracy of photolithography and the like, which are about one to several micrometers, for example. In the semiconductor device illustrated in FIG. 19, the thicknesses of the extension section 212 of the drift region 21 and the column region 22 can be smaller than the widths in the horizontal direction, which are several tens to several hundred nanometers, for example. This shortens the cycle of repetition of the extension section 212 and column section 22 which constitute the SJ structure. The semiconductor device illustrated in FIG. 19 is therefore easily pinched off.

Figure 19:
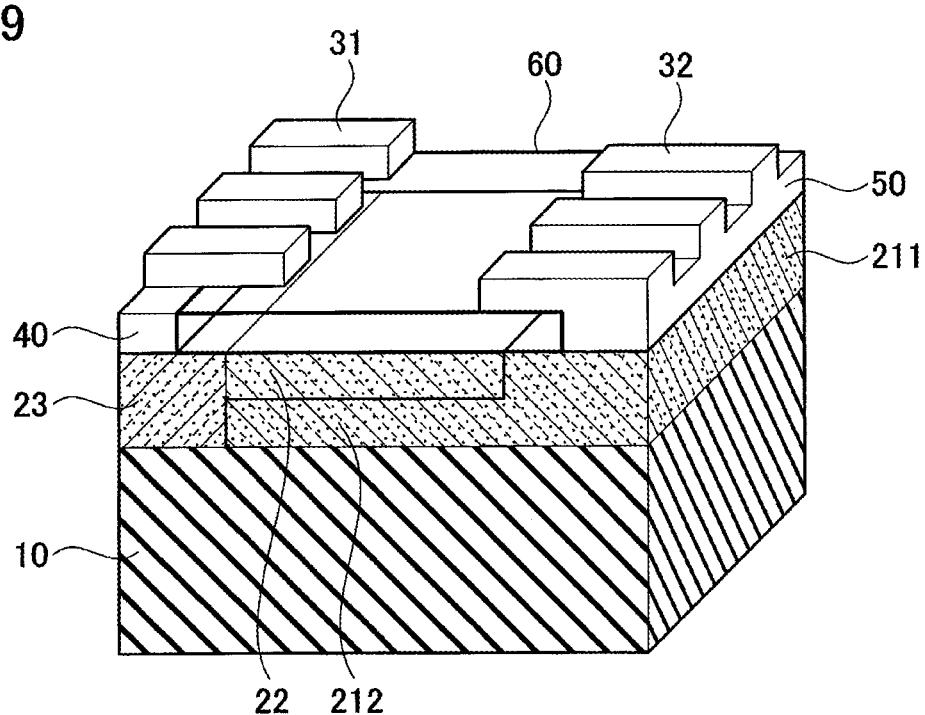
FIG. 19 is a schematic perspective view illustrating the configuration of a semiconductor device according to a third modification of the first embodiment of the present invention.

The semiconductor device in FIG. 19 includes the single extension section 212 of the drift region 21 as a layer and the single column region 22 as another layer. However, plural extension sections 212 and plural column regions 22 are alternately stacked on top of each other. This constitutes an SJ structure in which plural pn junctions are arranged at regular intervals in the thickness direction of the substrate 10. Such a structure further increases the breakdown voltage of the semiconductor device.

Second Embodiment

Figure 20:
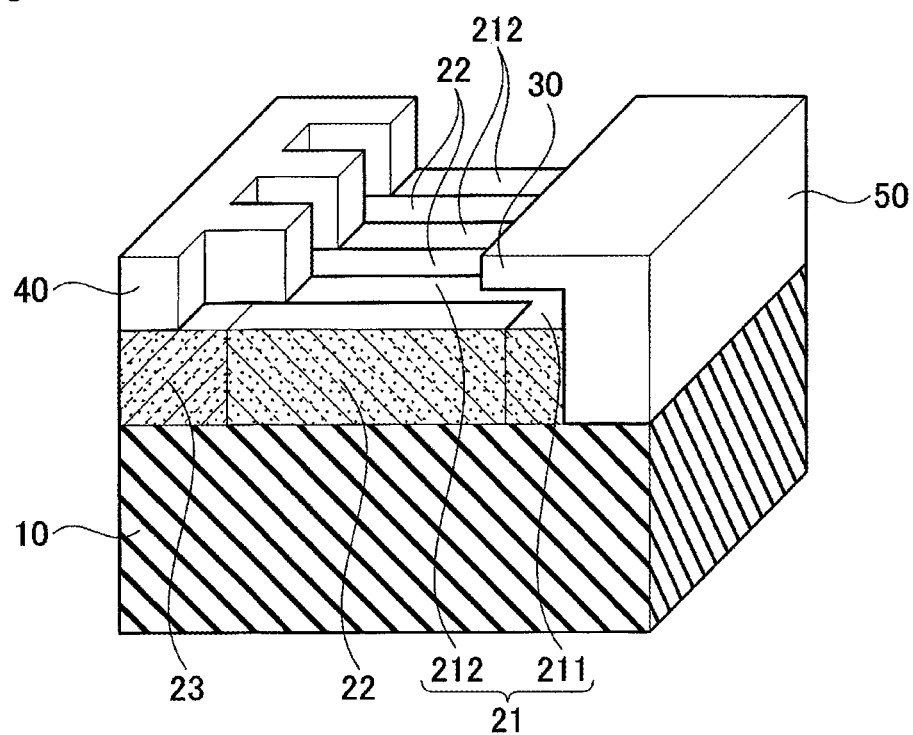
FIG. 20 is a schematic perspective view illustrating the configuration of a semiconductor device according to a second embodiment of the present invention.

In a semiconductor device according to a second embodiment of the present invention, as illustrated in FIG. 20, tips of the extension sections 212 of the drift region 21 connect to the first main electrode 40. The tips of the extension sections 212 and the first main electrode 40 are electrically connected through interfaces having an energy barrier. On the other hand, the second main electrode 50 forms an ohmic contact with the contact section 211 of the drift region 21.

The semiconductor device illustrated in FIG. 20 operates as a Schottky barrier diode (SBD) with the first main electrode 40 as the anode electrode and the second main electrode 50 as the cathode electrode. In this term, the semiconductor device illustrated in FIG. 20 is different from the semiconductor device illustrated in FIG. 1, which is a pn junction diode. The other configurations are the same as those of the first embodiment illustrated in FIG. 1.

The lower end of the second main electrode 50 reaches the substrate 10. The first main electrode 40 connects to the extension sections 212 of the drift region 21 and the well region 23. The second main electrode 50 connects to the side surface of the end of the contact section 211 of the drift region 21 and the substrate 10.

In the semiconductor device illustrated in FIG. 20, the first main electrode 40 is made of a metallic material of a high work function, such as a nickel (Ni) material or a platinum (Pt) material, to form Schottky junctions between the extension sections 212 of the drift region 21 and the first main electrode 40. The second electrode 50 is made of a material that has a low work function and can form an ohmic contact with the contact section 211 of the drift region 21, such as titanium (Ti).

In the semiconductor layer illustrated in FIG. 20, the electric field relaxing electrodes 30 are provided above peripheral pn junctions formed in regions where the contact section 211 of the drift region 21 connects to the column regions 22, with an insulating film interposed therebetween. This relaxes the electric field concentration in the peripheral pn junctions and thereby reduces the reduction in breakdown voltage of the semiconductor device. The other configurations are substantially the same as those of the first embodiment, and the redundant description is omitted.

Third Embodiment

Figure 21:
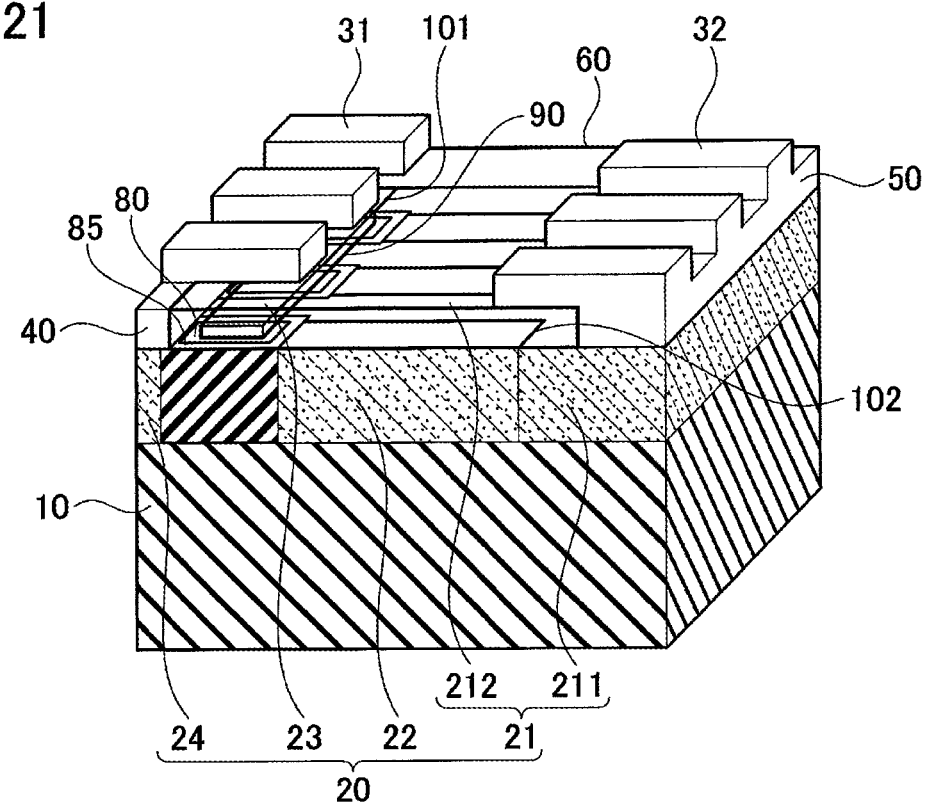
FIG. 21 is a schematic perspective view illustrating the configuration of a semiconductor device according to a third embodiment of the present invention.

A semiconductor device according to a third embodiment of the present invention further includes control electrodes 80, which are provided in a current path of the main current flowing between the first and second main electrodes 40 and 50 as illustrated in FIG. 21. The control electrodes 80 control the main current flowing through the current path. The semiconductor layer 20 includes a source region 24 of the first conductive type facing the drift region 21 with the well region 23 interposed therebetween. The first main electrode 40 electrically connects to the source region 24 and well region 23. The second main electrode 50 electrically connects to the contact section 211 of the drift region 21.

Plural gate trenches having openings each formed across the upper surfaces of the source region 24, any column region 22, and well region 23, extend and reach the substrate 10. On the inner wall surface of each gate trench, a gate insulating film 85 is provided. Each control electrode 80 is provided within any gate trench so as to face the well region 23 with the gate insulating film 85 interposed therebetween. The extension sections 212 of the drift region 21 connect to the well region 23 between the gate trenches. When the semiconductor device is on, channel regions are therefore formed in the well region 23 in contact with the gate insulating films 85.

The semiconductor device illustrated in FIG. 21 thus operates as a transistor with the first main electrode 40 as the source electrode, the second main electrode 50 as the drain electrode, and the control electrodes as the gate electrode. The first main electrode 40 forms ohmic contacts with the source region 24 and well region 23, and the second main electrode 50 forms an ohmic contact with the contact section 211 of the drift region 21. A control electrode line 90, which electrically connects the control electrodes 80, is formed on the upper surface of the control electrodes 80. For easy understanding of the structure, FIG. 21 illustrates only the outer edge of the control electrode line 90.

The other configurations are the same as those of the first embodiment illustrated in FIG. 1. In the semiconductor device illustrated in FIG. 21, the semiconductor layer 20 has an SJ structure, and the electric field relaxing electrodes 30 are provided above at least some of the peripheral pn junctions with the insulating film 60 interposed therebetween. The first electrode sections 31 of the electric field relaxing electrodes 30 which connect to the source electrode are provided above the first peripheral pn junctions 101 while the second electrode sections 32 which connect to the drain electrode are provided above the second peripheral pn junctions 102.

The following describes the basic operation of the semiconductor device illustrated in FIG. 21.

For on operation, the semiconductor device functions as a transistor by controlling the potential of the control electrodes 80 with a positive potential being applied to the second main electrode 50 based on the potential of the first main electrode 40 as the reference. Specifically, setting the voltage across each control electrode 80 and the first main electrode 40 to a predetermined threshold voltage or higher produces inversion layers in channel regions of the well region 23 on the side surface of the control electrode 80. The semiconductor device is thereby turned on, allowing the main current to flow between the first and second main electrodes 40 and 50.

On the other hand, for off operation, the voltage across each control electrode 80 and the first main electrode 40 is set to lower than the predetermined threshold voltage. The inversion layer thereby disappears, and the main current is shut off.

In the off-state, the depletion layers spread from the interfaces between the extension sections 212 of the drift region 21 and the column regions 22. When the reverse voltage is increased to a certain degree, the extension sections 212 of the drift region 21 and the column regions 22 are pinched off. The electric field in the extension sections 212 of the drift region 21 and the column regions 22 uniformly distributes in a rectangular shape, and the maximum electric field applied to the semiconductor device is reduced significantly.

Furthermore, providing the electric field relaxing electrodes 30 above the peripheral pn junctions relaxes the electric field concentration in the peripheral pn junctions. This reduces the reduction in breakdown voltage of the semiconductor device. The other configurations are substantially the same as those of the first embodiment, and the redundant description is omitted.

The following describes a method of manufacturing the semiconductor device according to the third embodiment of the present invention with reference to the drawings. The following method of manufacturing the semiconductor device is just an example and can be implemented by other various manufacturing methods including modifications of the same.

Figure 22:
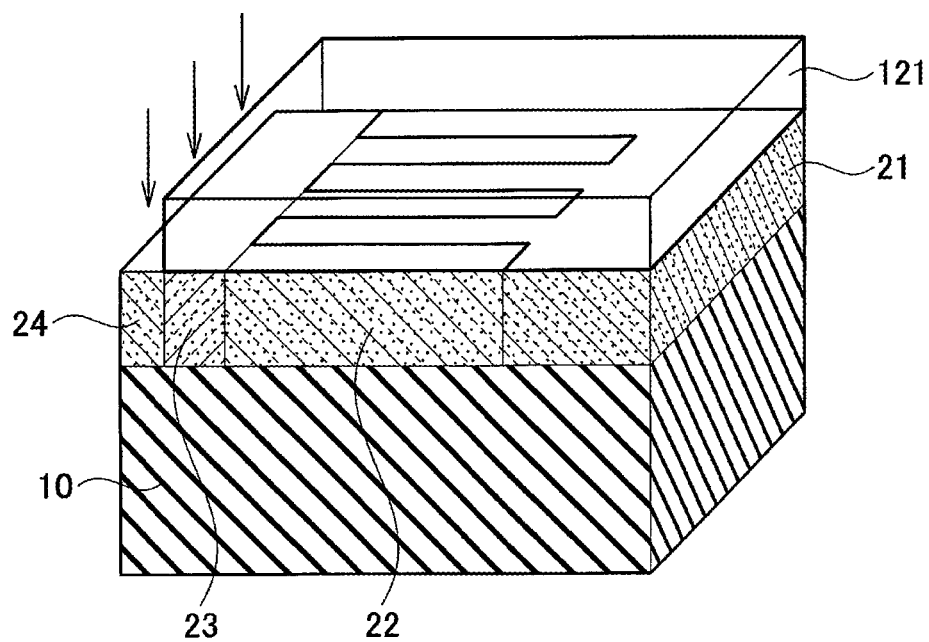
FIG. 22 is a perspective view for explaining a method of manufacturing the semiconductor device according to the third embodiment of the present invention (No. 1).

In a similar manner to the method described in the first embodiment with reference to FIGS. 9 to 12, the well region 23, drift region 21, and column regions 22 are formed in the substrate 10. Subsequently, as illustrated in FIG. 22, the n-type source region 24 is formed by ion implantation using a patterned mask material 121 as a mask. The impurity concentration of the source region 24 is about 1E18 to 1E21/cm$^3$, for example.

Figure 23:
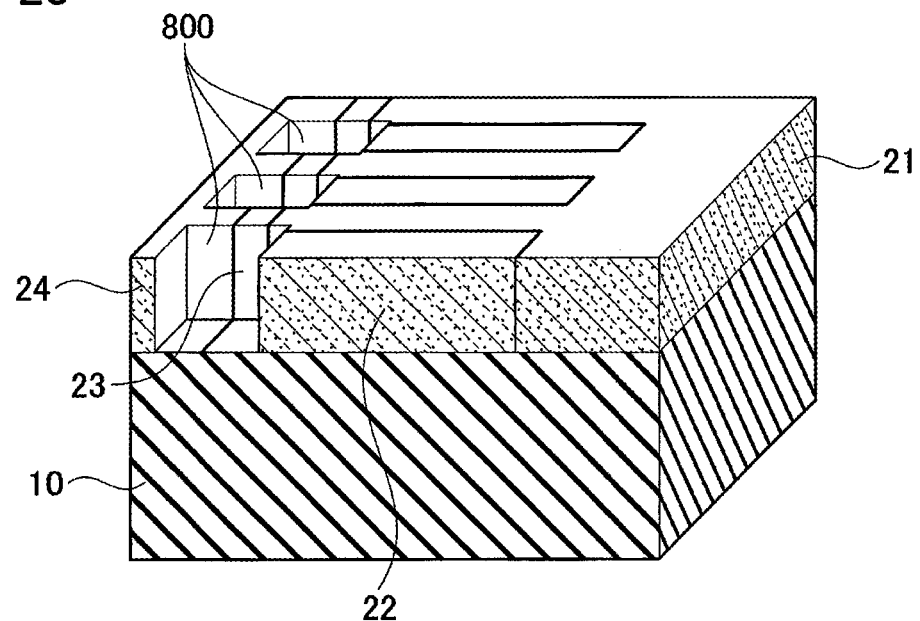
FIG. 23 is a perspective view for explaining the method of manufacturing the semiconductor device according to the third embodiment of the present invention (No. 2).

Next, gate trenches 800 are formed by dry etching using a patterned mask material (not illustrated) as a mask as illustrated in FIG. 23. Each gate trench 800 is formed to a depth reaching the substrate 10 in a range across the source region 24, the well region 23, any extension section 212 of the drift region 21, and any column region 22.

Thereafter, the gate insulating films 85 are formed on the inner wall surfaces of the gate trenches 800. The method of forming the gate insulating films 85 may be either thermal oxidation or deposition. In the case of thermal oxidation, for example, the substrate is heated to about 1100° C. in an oxygen atmosphere, thus forming silicon oxide film in every section of the substrate exposed to oxygen.

After the gate insulating films 85 are formed, the substrate may be annealed at about 1000° C. in an atmosphere of nitrogen, argon, N$_2$O, or the like in order to reduce the interface state at interfaces between the well region 23 and the gate insulating films 85. The substrate may be subjected to thermal oxidation in an NO or N$_2$O atmosphere. In this case, the temperature is preferably 1100 to 1400° C. The gate insulating films 85 have a thickness of several tens micrometers.

Next, the gate trenches 800 are filled to form the control electrodes 80. The material of the control electrodes 80 is typically polysilicon film. In the following description, the control electrodes 80 are made of polysilicon film.

The method of depositing the polysilicon film can be low-pressure CVD or the like. For example, each gate trench 800 is filled with the polysilicon film by setting the thickness of the polysilicon film to be deposited, greater than a half of the width of the gate trench 800. Since the polysilicon film is formed from the inner wall surface of the gate trench 800, setting the thickness of the polysilicon film as described above allows the gate trench 800 to be completely filled with the polysilicon film. When the width of the gate trenches 800 is 2 μm, for example, the polysilicon film is formed to a thickness of greater than 1 μm. After the polysilicon film is deposited, the substrate is annealed at 950° C. in phosphorous oxychloride (POCl$_3$), so that n-type polysilicon film is formed and the control electrodes 80 are made conductive.

Figure 24:
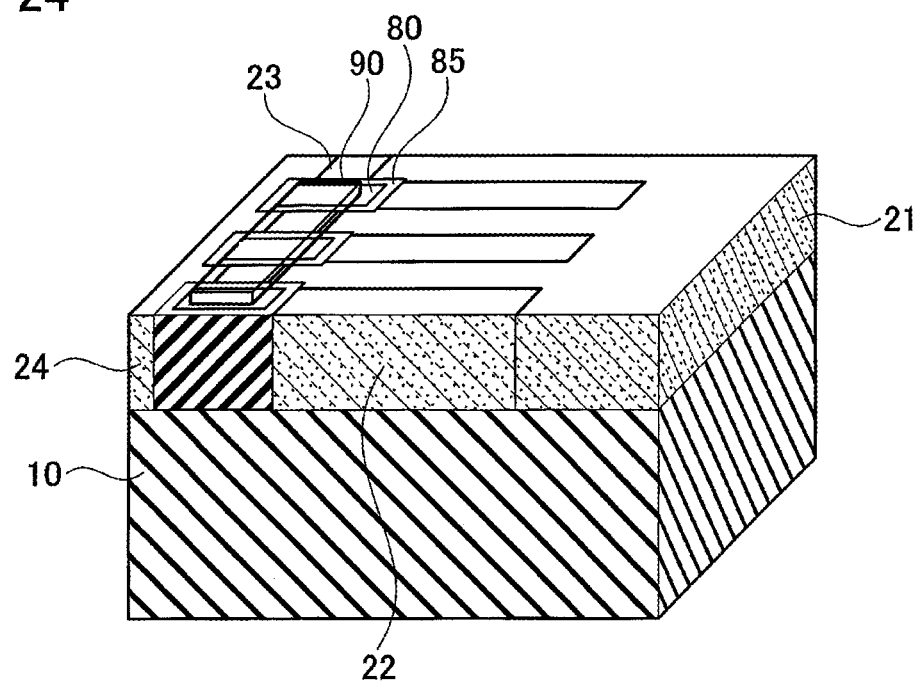
FIG. 24 is a perspective view for explaining the method of manufacturing the semiconductor device according to the third embodiment of the present invention (No. 3).

Next, the polysilicon film is etched to be flattened. The etching method may be either isotropic etching or anisotropic selective etching. The etching depth is set so that the polysilicon film remains within the gate trenches 800. When the polysilicon film is deposited to a thickness of 1.5 μm in the gate trenches 800 having a width of 2 μm, for example, the etching depth of the polysilicon film is set to 1.5 μm. However, in control of etching, there is no problem with several percent over etching for an etching depth of 1.5 μm. Thereafter, as illustrated in FIG. 24, the control electrode line 90 is formed to electrically connect the control electrodes 80.

Figure 25:
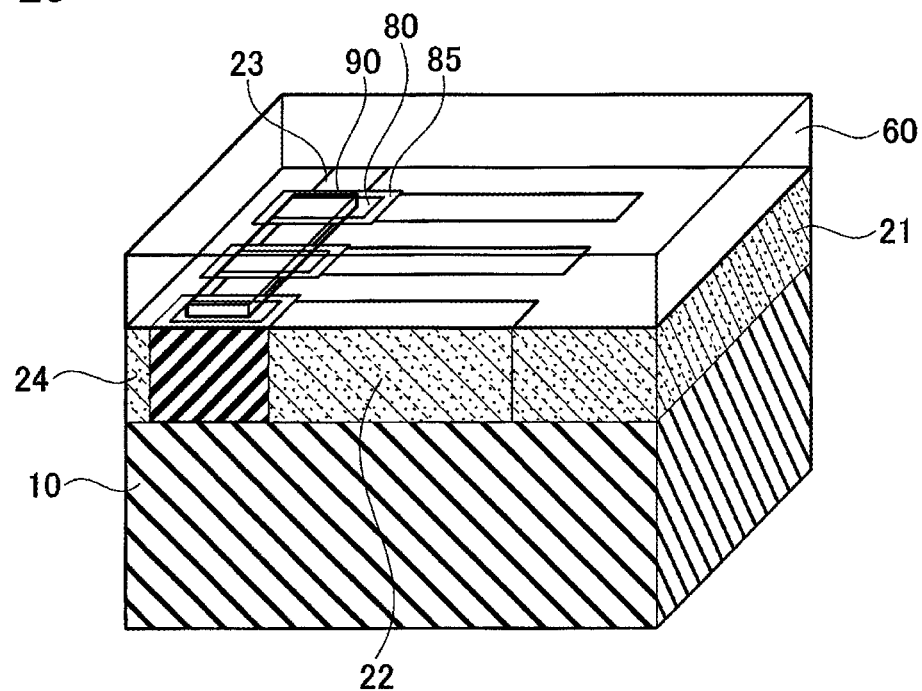
FIG. 25 is a perspective view for explaining the method of manufacturing the semiconductor device according to the third embodiment of the present invention (No. 4).

Next, as illustrated in FIG. 25, the insulating film 60 is formed on the entire surface. The insulating film 60 is silicon oxide film, for example. The deposition method can be thermal CVD or plasma CVD.

The insulating film 60 is then selectively etched by photolithography or the like using a patterned photoresist film as a mask to form contact holes. The contact holes formed in the insulating film 60 are filled to form the first and second electrode films 71 and 72. The materials of the first and second electrode films 71 and 72 can be metallic materials, such as Ti, Ni, or MO, or laminate film of Ti/Ni/Ag or the like.

Figure 26:
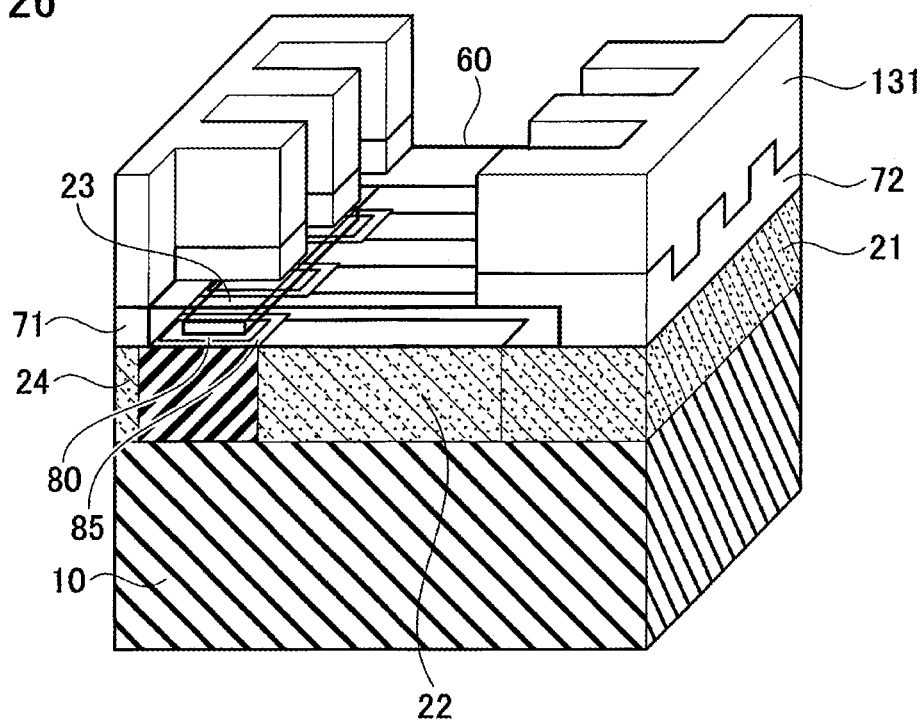
FIG. 26 is a perspective view for explaining the method of manufacturing the semiconductor device according to the third embodiment of the present invention (No. 5).

For example, the first and second electrode films 71 and 72 are formed by depositing the metallic material on the entire surface by spattering or EB vapor deposition and etching the metallic material by dry etching using a photoresist film 131 as a mask, as illustrated in FIG. 26. Alternatively, the first and second electrode films 71 and 72 may be formed by filling the contact holes with the metallic material by a plating process.

In this process, the electrode films 70 are formed so that some sections of the first electrode film 71 and some sections of the second electrode film 72 cover the peripheral pn junctions with the insulating film 60 interposed therebetween. The sections of the first electrode films 71 provided above the peripheral pn junctions 101 correspond to the first electrode sections 31 of the electric field relaxing electrodes 30. The sections of the second electrode films 72 provided above the peripheral pn junctions 102 correspond to the second electrode sections 32 of the electric field relaxing electrodes 30.

The semiconductor device illustrated in FIG. 21 is thus completed. In the above-described example, the control electrodes 80 are made of polysilicon film of the first conductive type. However, the control electrodes 80 may be made of polysilicon film of the second conductive type. The control electrodes 80 may be made of another semiconductor material or may be made of another conductive material, such as a metallic material. For example, the control electrodes 80 can be made of polysilicon carbide of the second conductive type, SiGe, or Al.

In the above-described example, the gate insulating films 85 are made of silicon oxide film. The gate insulating films 85 may be made of silicon nitride film. The gate insulating films 85 may be made of laminate film of silicon oxide film and silicon nitride film. When the gate insulating films 85 are made of silicon nitride film, the isotropic etching can be performed by washing with hot phosphoric acid at 160° C.

In the above-described case, the semiconductor device is a MOS transistor with the first main electrode 40 as the source electrode, the second main electrode 50 as the drain electrode, and the control electrodes 80 as the gate electrode. However, the semiconductor device may be a transistor of another type. For example, also in a bipolar transistor with the first main electrode 40 as the emitter electrode, the second main electrode 50 as the collector electrode, and the control electrodes 80 as the base electrode, providing the electric field relaxing electrodes 30 above the peripheral pn junctions reduces the reduction in breakdown voltage of the semiconductor device.

Other Embodiment

As described above, the present invention is described with the embodiments. However, it should not be understood that the description and drawings constituting a part of the disclosure will limit the present invention. This disclosure will allow those skilled in the art to understand various substitutions, examples, and operation techniques.

In the above-described example, the main electrodes and the electric field relaxing electrodes 30 are integrally formed, for example. However, the main electrodes and the electric field relaxing electrodes 30 may be formed separately. This allows the relaxation of electric field concentration to be controlled independently of the operation of the semiconductor device. For example, the parasitic capacitance between the electric field relaxing electrodes 30 and the semiconductor layer 20 can be reduced preferentially. In addition, the first main electrode 40 and first electrode sections 31 may be electrically connected by a metallic line or the like, and the second main electrode 50 and second electrode sections may be electrically connected by a metallic line or the like.

As described above, it is obvious that the present invention includes various embodiments and the like not described in this disclosure.

INDUSTRIAL APPLICABILITY

The semiconductor device of the present invention and the method of manufacturing the semiconductor device are applicable to electronics industry including manufacturers who manufacture semiconductor devices having SJ structures.

REFERENCE SIGNS LIST

10 SUBSTRATE
20 SEMICONDUCTOR LAYER
21 DRIFT REGION
22 COLUMN REGION
23 WELL REGION
24 SOURCE REGION
30 ELECTRIC FIELD RELAXING ELECTRODE
31 FIRST ELECTRODE SECTION
32 SECOND ELECTRODE SECTION
40 FIRST MAIN ELECTRODE
50 SECOND MAIN ELECTRODE
60 INSULATING FILM
80 CONTROL ELECTRODE
85 GATE INSULATING FILM
211 CONTACT SECTION
212 EXTENSION SECTION
213 LAYERED SECTION

The invention claimed is:
1. A semiconductor device, comprising:
a substrate;
a drift region of a first conductive type which is provided on a main surface of the substrate, the drift region including a contact section and extension sections extending from part of the contact section along the main surface of the substrate;
column regions of a second conductive type which alternate with the extension sections in a perpendicular direction to the extension direction of the extension sections of the drift region and at least some of the column regions include an end connecting to the contact section;
a well region of a second conductive type which connects to the other end of each column region and tips of the extension sections of the drift region;
a first main electrode which electrically connects to the well region;
a second main electrode which electrically connects to the contact section of the drift region;
an insulating film which is provided above the drift region, the column regions, and the well region; and electric field relaxing electrodes which are provided above at least some peripheral pn junctions with the insulating film interposed therebetween, the peripheral pn junctions being pn junctions other than voltage holding pn junctions formed in interfaces between the extension sections of the drift region and the column regions, wherein the electric field relaxing electrodes are provided above at least some of the peripheral pn junctions that are adjacent to the first main electrode and each include a section electrically connecting to the first main electrode, the electric field relaxing electrodes are provided above at least any of the peripheral pn junctions where the extension sections of the drift region connect to the well region and the peripheral pn junctions where the contact section of the drift region connects to the column regions, wherein the peripheral pn junctions in which the electric field relaxing electrodes are arranged above include only first peripheral pn junctions where the well region connects to the tips of the extension sections and second peripheral pn junctions, wherein ends of the column regions connect to the contact section.

2. The semiconductor device according to claim 1, wherein the electric field relaxing electrodes are provided above at least some of the peripheral pn junctions that are adjacent to the second main electrode and each include a section electrically connecting to the second main electrode.

3. The semiconductor device according to claim 1, wherein width of each of the electric field relaxing electrodes in the perpendicular direction to the extension direction is greater in a region above any peripheral pn junction than in other regions being regions excluding the region above the peripheral pn junction.

4. The semiconductor device according to claim 1, wherein the substrate is an insulating substrate.

5. The semiconductor device according to claim 1, wherein a distance between a lower surface of each of the electric field relaxing electrodes and the substrate decreases gradually so that the distance from the peripheral pn junction below the electric field relaxing electrode to each section of the lower surface of the electric field relaxing electrode which faces the substrate is substantially constant.

6. The semiconductor device according to claim 1, wherein the drift region further includes a layered section which is layered on the column regions in the thickness direction of the substrate with an end connecting to the contact section and the other end connecting to the well region.

7. The semiconductor device according to claim 1, wherein the semiconductor device has a structure in which the extension sections of the drift region and the column regions are stacked on top of each other in the thickness direction of the substrate.

8. The semiconductor device according to claim 1, wherein impurity concentrations of the extension sections and the column regions are set so that in an off state where main current flowing between the first and second main electrodes is shut off, the extension sections of the drift region and the column regions are depleted due to depletion layers spreading from the voltage holding pn junctions.

9. The semiconductor device according to claim 1, wherein the tips of the extension sections of the drift region and the first main electrode are electrically connected through interfaces having an energy barrier, the second main electrode forms an ohmic contact with the contact section of the drift region, and the semiconductor device operates as a Schottky barrier diode with the first main electrode as an anode electrode and the second main electrode as a cathode electrode.

10. The semiconductor device according to claim 1, further comprising a control electrode provided in a current path of a main current flowing between the first and second main electrodes, wherein the first main electrode forms an ohmic contact with the well region, the second main electrode forms an ohmic contact with the contact section of the drift region, and the semiconductor device operates as a transistor in which the control electrode controls the main current.

11. A method of manufacturing a semiconductor device, comprising:

forming a drift region of a first conductive type on a main surface of a substrate, the drift region including a contact section and extension sections extending from part of the contact section along a main surface of the substrate;

forming column regions of a second conductive type which alternate with the extension sections in a perpendicular direction to the extension direction of the extension sections of the drift region and at least some of the column regions include an end connecting to the contact section of the drift region;

forming a well region of a second conductive type which connects to the other end of each column region and tips of the extension sections of the drift region;

forming a first main electrode which electrically connects to the well region;

forming a second main electrode which electrically connects to the contact section of the drift region;

forming an insulating film which is provided above the drift region, the column regions, and the well region; and forming electric field relaxing electrodes which are provided above at least some of peripheral pn junctions with the insulating film interposed therebetween, the peripheral pn junctions being pn junctions other than voltage holding pn junctions formed in interfaces between the extension sections of the drift region and the column regions, wherein the electric field relaxing electrodes are provided above at least some of the peripheral pn junctions that are adjacent to the first main electrode and each include a section electrically connecting to the first main electrode, the electric field relaxing electrodes are provided above at least any of the peripheral pn junctions where the extension sections of the drift region connect to the well region and the peripheral pn junctions where the contact section of the drift region connects to the column regions, wherein the peripheral pn junctions in which the electric field relaxing electrodes are arranged above include only first peripheral pn junctions where the well region connects to the tips of the extension sections and a second peripheral pn junctions.

12. The method of manufacturing a semiconductor device according to claim 11, wherein the drift region and the column regions are formed by ion implantation of impurities into the substrate.

\* \* \* \* \*